US010613273B2

(12) United States Patent
Mentovich et al.

(10) Patent No.: US 10,613,273 B2
(45) Date of Patent: Apr. 7, 2020

(54) OPTICAL COMPONENT ASSEMBLY AND WAVEGUIDE LOOPBACK

(71) Applicant: Mellanox Technologies, Ltd., Yokneam (IL)

(72) Inventors: Elad Mentovich, Tel Aviv (IL); Yaakov Gridish, Yokneam Elit (IL); Oded Wertheim, Tel Aviv (IL); Sylvie Rockman, Zichron Yaakov (IL); Benny Koren, Zichron Yaakov (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/974,757

(22) Filed: May 9, 2018

(65) Prior Publication Data

US 2018/0335567 A1    Nov. 22, 2018

Related U.S. Application Data

(60) Provisional application No. 62/508,762, filed on May 19, 2017.

(51) Int. Cl.
*G02B 6/26* (2006.01)
*G02B 6/12* (2006.01)
(Continued)

(52) U.S. Cl.
CPC .......... *G02B 6/12004* (2013.01); *G02B 6/13* (2013.01); *G02B 6/42* (2013.01); *H01S 5/0262* (2013.01);
(Continued)

(58) Field of Classification Search
CPC .............. G02B 6/12004; G02B 6/42; G02B 2006/12111; H01S 5/0262
See application file for complete search history.

(56) References Cited

U.S. PATENT DOCUMENTS

| 7,049,672 B2* | 5/2006 | Headley | G02B 6/4207 257/103 |
| 7,224,519 B2* | 5/2007 | Shin | H01S 5/0265 359/344 |

(Continued)

OTHER PUBLICATIONS

Schares et al "Terabus: Terabit/Second-Class Card-Level Optical Interconnect Technologies", IEEE Journal of Selected Topics in Quantum Electronics, vol. 12, No. 5, Sep./Oct. 2006 (Year: 2006).*

*Primary Examiner* — Ellen E Kim
(74) *Attorney, Agent, or Firm* — Alston & Bird LLP

(57) ABSTRACT

An optical component assembly is provided including a substrate. The assembly includes an optical transmitter configured to transmit an optical signal, an optical receiver configured to receive the optical signal, and an optical waveguide extending between the optical transmitter and the optical receiver. The assembly further includes a frangible region defining a first portion of the substrate and a second portion of the substrate, wherein the frangible region is configured to allow the first portion to be separated from the second portion. The assembly may be configured to be modified from a testing configuration, in which the first portion is integrally connected to the second portion via the frangible region, to an operational configuration, in which the first portion is separated from the second portion such that communication of optical signals between the optical transmitter and the optical receiver is precluded.

18 Claims, 8 Drawing Sheets

(51) Int. Cl.
   *G02B 6/42*      (2006.01)
   *H01S 5/026*     (2006.01)
   *G02B 6/13*      (2006.01)
   *G02B 6/125*     (2006.01)

(52) U.S. Cl.
   CPC .... *G02B 6/125* (2013.01); *G02B 2006/12111* (2013.01)

(56) References Cited

U.S. PATENT DOCUMENTS

| | | | | |
|---|---|---|---|---|
| 7,424,041 | B2* | 9/2008 | Meliga | B82Y 20/00 |
| | | | | 372/20 |
| 8,363,993 | B2* | 1/2013 | Yu | H04B 10/801 |
| | | | | 385/101 |
| 9,989,713 | B1* | 6/2018 | Cyr | G02B 6/4239 |
| 2003/0081878 | A1* | 5/2003 | Joyner | G02B 6/12019 |
| | | | | 385/14 |
| 2008/0069494 | A1* | 3/2008 | Oggioni | G02B 6/43 |
| | | | | 385/14 |
| 2009/0081828 | A1* | 3/2009 | Freidhoff | B81C 1/00888 |
| | | | | 438/113 |
| 2011/0135265 | A1* | 6/2011 | Park | G02B 6/13 |
| | | | | 385/129 |
| 2012/0163811 | A1* | 6/2012 | Doany | G02B 6/43 |
| | | | | 398/41 |
| 2014/0133851 | A1* | 5/2014 | Zeltser | H04Q 11/0005 |
| | | | | 398/45 |
| 2015/0109661 | A1* | 4/2015 | Li | G02B 6/29331 |
| | | | | 359/341.4 |

* cited by examiner

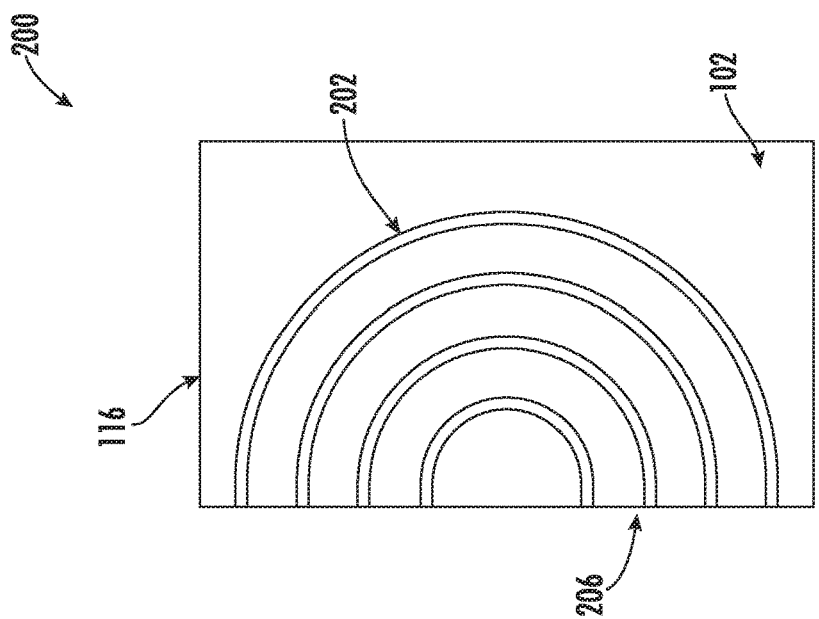
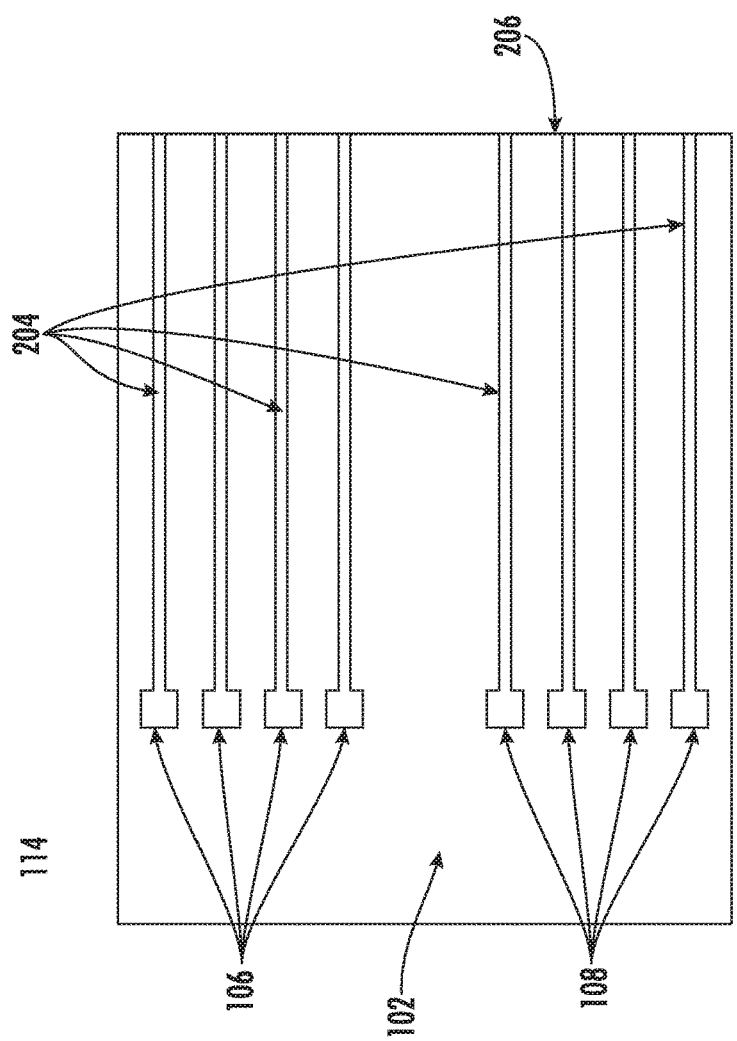
FIG. 3B
FIG. 3A

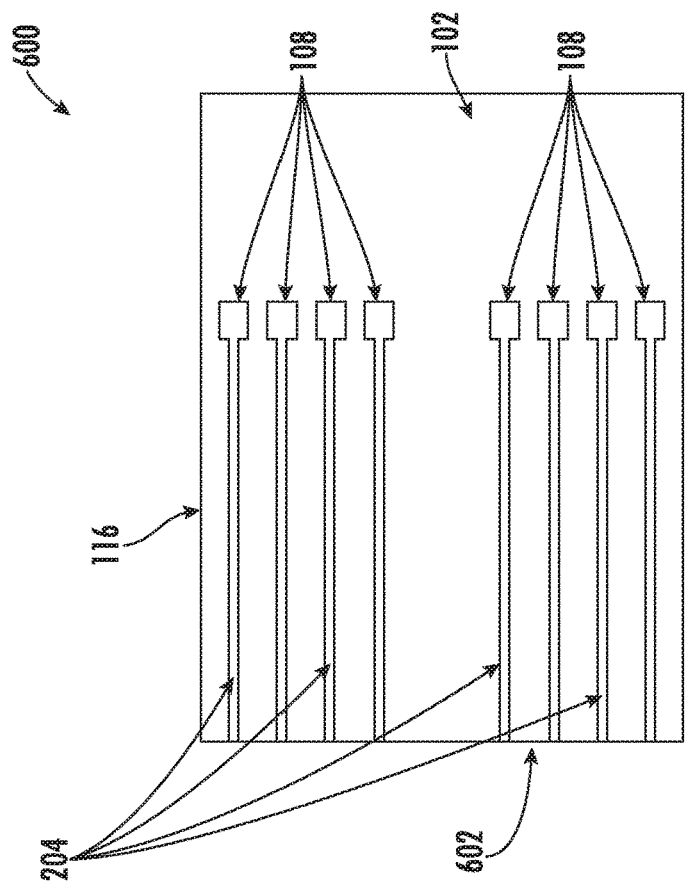
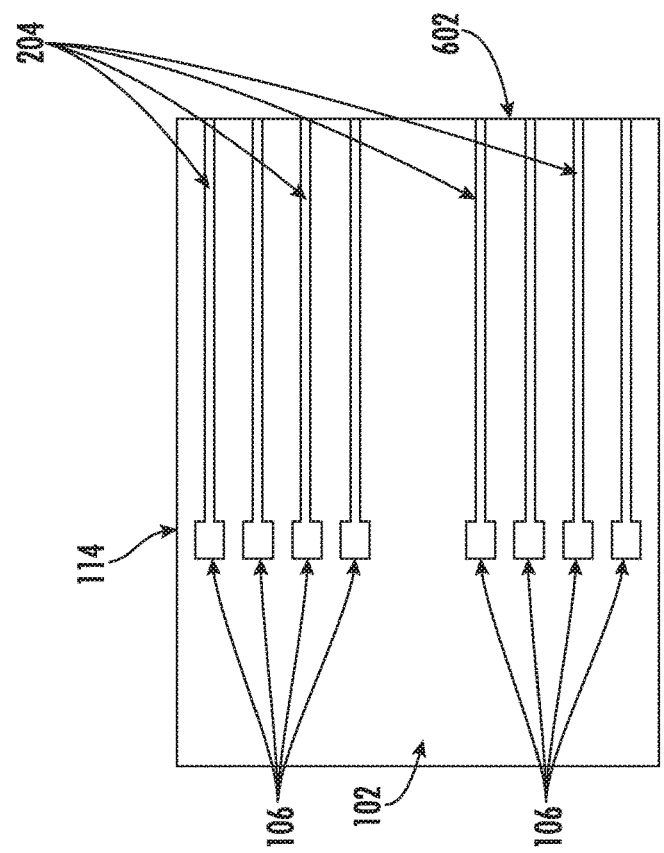

OPTICAL COMPONENT ASSEMBLY AND WAVEGUIDE LOOPBACK

CROSS-REFERENCE TO RELATED APPLICATIONS

This application incorporates U.S. Provisional Application No. 62/508,762 filed May 19, 2017, by reference herein in its entirety.

BACKGROUND

The present disclosure relates generally to optical components and associated assemblies. In particular, assemblies and associated methods are described that facilitate evaluation of optical components prior to commercial use, such as in a high bandwidth environment.

Optoelectronic communication systems and optical components, often utilized in data centers, are often configured to transmit signals over optical waveguides. These optoelectronic communication systems may utilize separate circuitry that facilitates the transmissions along the optical cables using one or more transducers, transceivers, photodiodes, lenses, and the like. For example, modern optoelectronic communication systems may utilize vertical-cavity surface-emitting lasers (VCSELs) as optical transmitters/transducers that convert electrical signals to optical signals for transmission through optical waveguides.

Often, the high costs associated with producing optoelectronic communication systems are determined in large part by the high manufacturing and testing costs associated with optical components utilized therein. Particularly, ensuring the success rate of optical transceivers, photodiodes, VCSELs, and the like by monitoring and evaluating operational parameters prior to commercial use often requires expensive testing procedures. The inventors have identified a number of additional deficiencies and problems associated with conventional optical component assemblies and associated testing procedures. Through applied effort, ingenuity, and innovation, many of these identified problems have been solved by developing solutions that are included in embodiments of the present invention, many examples of which are described in detail herein.

BRIEF SUMMARY OF THE INVENTION

Accordingly, the apparatuses and methods of manufacturing described herein provide an optical component assembly for testing optical components. In some embodiments, an optical component assembly may include a substrate and an optical transmitter configured to transmit an optical signal, where the optical transmitter may be disposed on a first surface of the substrate. The optical component assembly may include an optical receiver configured to receive the optical signal, where the optical receiver may be disposed on the first surface of the substrate and an optical waveguide extending between the optical transmitter and the optical receiver, where the optical waveguide may be configured to direct the optical signal from the optical transmitter to the optical receiver. The optical component assembly may include a frangible region defining a first portion of the substrate and a second portion of the substrate, where the frangible region may be configured to allow the first portion to be separated from the second portion. The optical component assembly may be configured to be modified from a testing configuration, in which the first portion is integrally connected to the second portion via the frangible region for communicating optical signals between the optical transmitter and the optical receiver via the optical waveguide, to an operational configuration, in which the first portion is separated from the second portion such that communication of optical signals between the optical transmitter and the optical receiver is precluded. In the operational configuration, at least one of the first portion or the second portion may be configured to be operable in an optical assembly.

In some embodiments, the assembly may include a plurality of optical transmitters disposed on the first surface and a plurality of corresponding optical receivers disposed on the first surface, where each optical transmitter may be connected to a corresponding optical receiver via an optical waveguide.

In such an embodiment, the frangible region may be further configured to allow separation of the optical component assembly into the first portion and the second portion such that the transmission of optical signals between each optical transmitter and each corresponding optical receiver is precluded.

In some cases, the optical transmitter and the optical receiver may be disposed on the first portion of the substrate and a loopback waveguide portion may be disposed on the second portion of the substrate.

In other cases, the optical transmitter may be disposed on the first portion of the substrate and the optical receiver may be disposed on the second portion of the substrate.

In some embodiments, the optical transmitter may be a vertical-cavity surface-emitting laser and the optical receiver may be a photodiode.

In some further embodiments, the frangible region further may include a line of weakness or a notch.

In some embodiments, the frangible region may be achieved via a cleaving process.

In other embodiments, the frangible region may include a scribe line, where separation of the assembly into at least two portions may be achieved via a scribe and break process.

In some cases, the assembly may be further configured to connect with an optoelectronic testing element such that the optical transmitter is configured to receive electrical signals from the optoelectronic testing element.

In other embodiments, a method of manufacturing an optical component assembly is provided. The method may include providing a substrate, disposing an optical transmitter configured to transmit an optical signal on a first surface of the substrate, and disposing an optical receiver configured to receive the optical signal on the first surface of the substrate. The method may also include providing an optical waveguide extending between the optical transmitter and the optical receiver, where the optical waveguide may be configured to direct the optical signal from the optical transmitter to the optical receiver and forming a frangible region, where the frangible region may define a first portion of the substrate and a second portion of the substrate, where the frangible region may be configured to allow the first portion to be separated from the second portion. The optical component assembly may be configured to be modified from a testing configuration, in which the first portion is integrally connected to the second portion via the frangible region for communicating optical signals between the optical transmitter and the optical receiver via the optical waveguide, to an operational configuration, in which the first portion is separated from the second portion such that communication of optical signals between the optical transmitter and the optical receiver is precluded. In the operational configuration, at least one of the first portion or the second portion may be configured to be operable in an optical assembly.

In some embodiments, the method may include disposing a plurality of optical transmitters and a plurality of corresponding optical receivers on the first surface, where each optical transmitter may be connected to a corresponding optical receiver via an optical waveguide.

In such an embodiment, the frangible region may be further configured to allow separation of the optical component assembly into the first portion and the second portion such that the transmission of optical signals between each optical transmitter and each corresponding optical receiver is precluded.

In some cases, the optical transmitter and the optical receiver may be disposed on the first portion of the substrate and a loopback waveguide portion may be disposed on the second portion of the substrate.

In other cases, the optical transmitter may be disposed on the first portion of the substrate and the optical receiver may be disposed on the second portion of the substrate.

In some embodiments, the optical transmitter may be a vertical-cavity surface-emitting laser and the optical receiver may be a photodiode.

In some further embodiments, forming the frangible region further may include a line of weakness or a notch.

In some embodiments, forming the frangible region may be achieved via a cleaving process.

In other embodiments, forming the frangible region may include scribing the substrate and separating of the assembly into at least two portions via a scribe-and-break process In some cases, the assembly may be further configured to connect with an optoelectronic testing element such that the optical transmitter is configured to receive electrical signals from the optoelectronic testing element.

BRIEF DESCRIPTION OF THE SEVERAL VIEWS OF THE DRAWINGS

Figure 1:
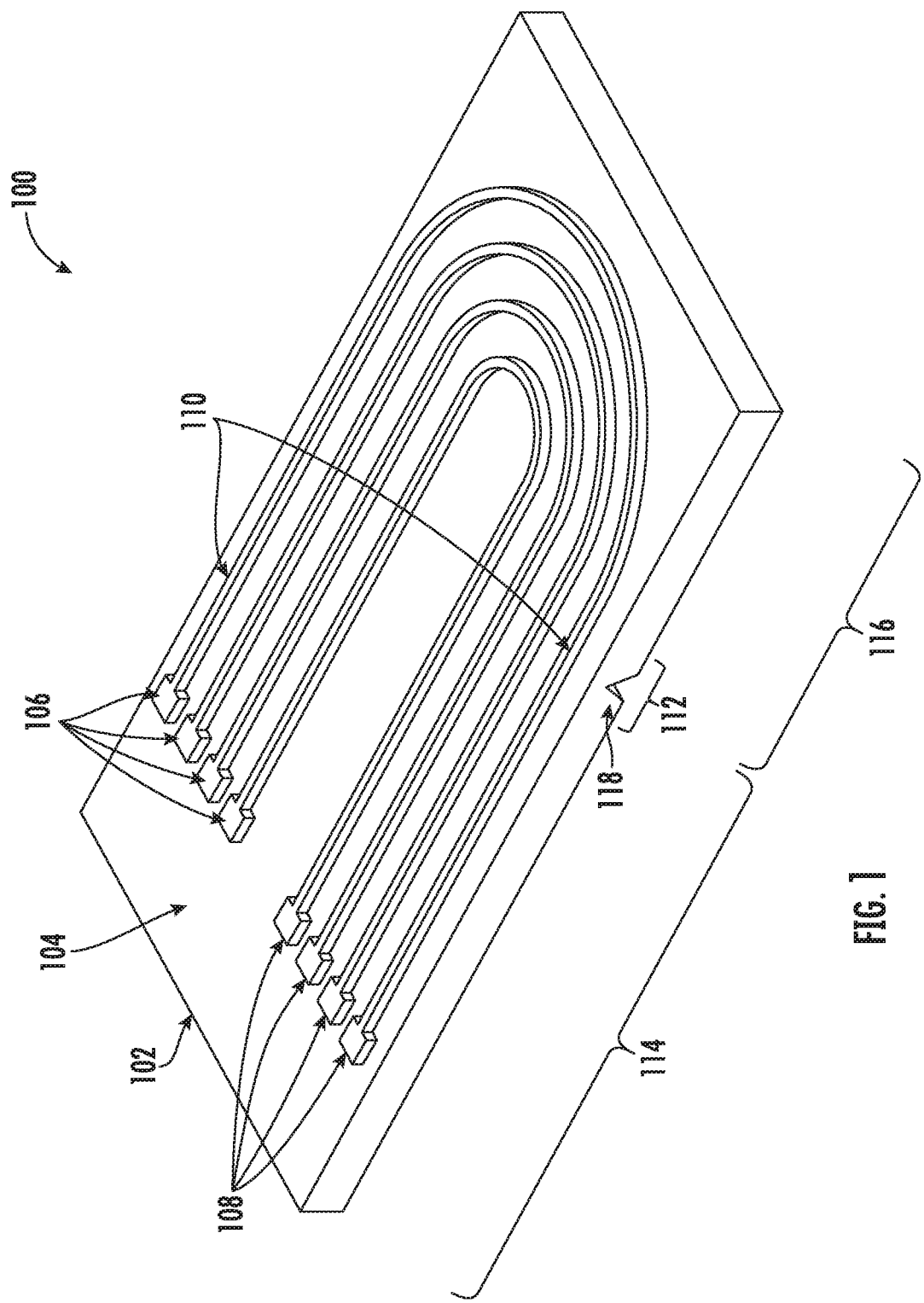
Figure 2:
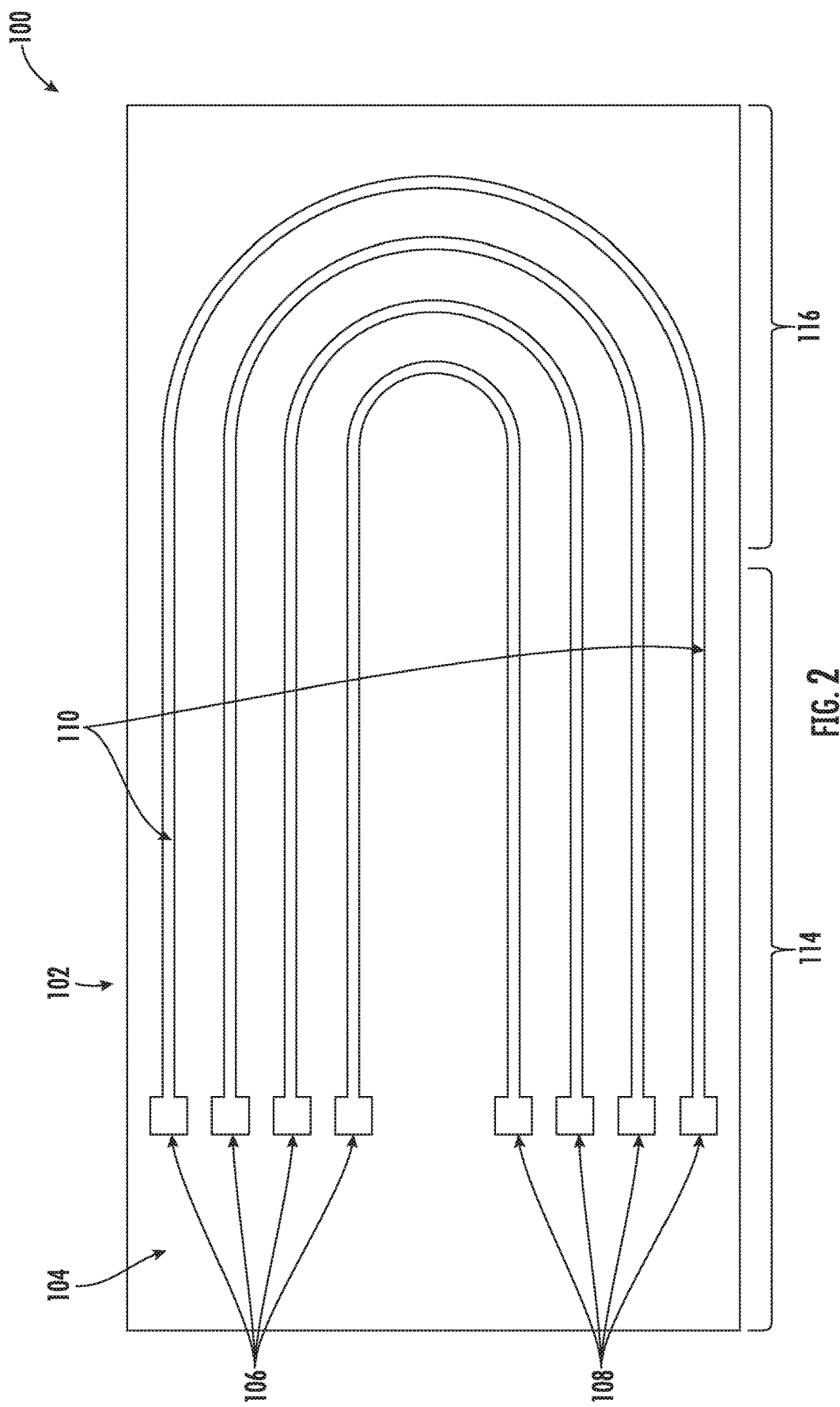
Figure 4:
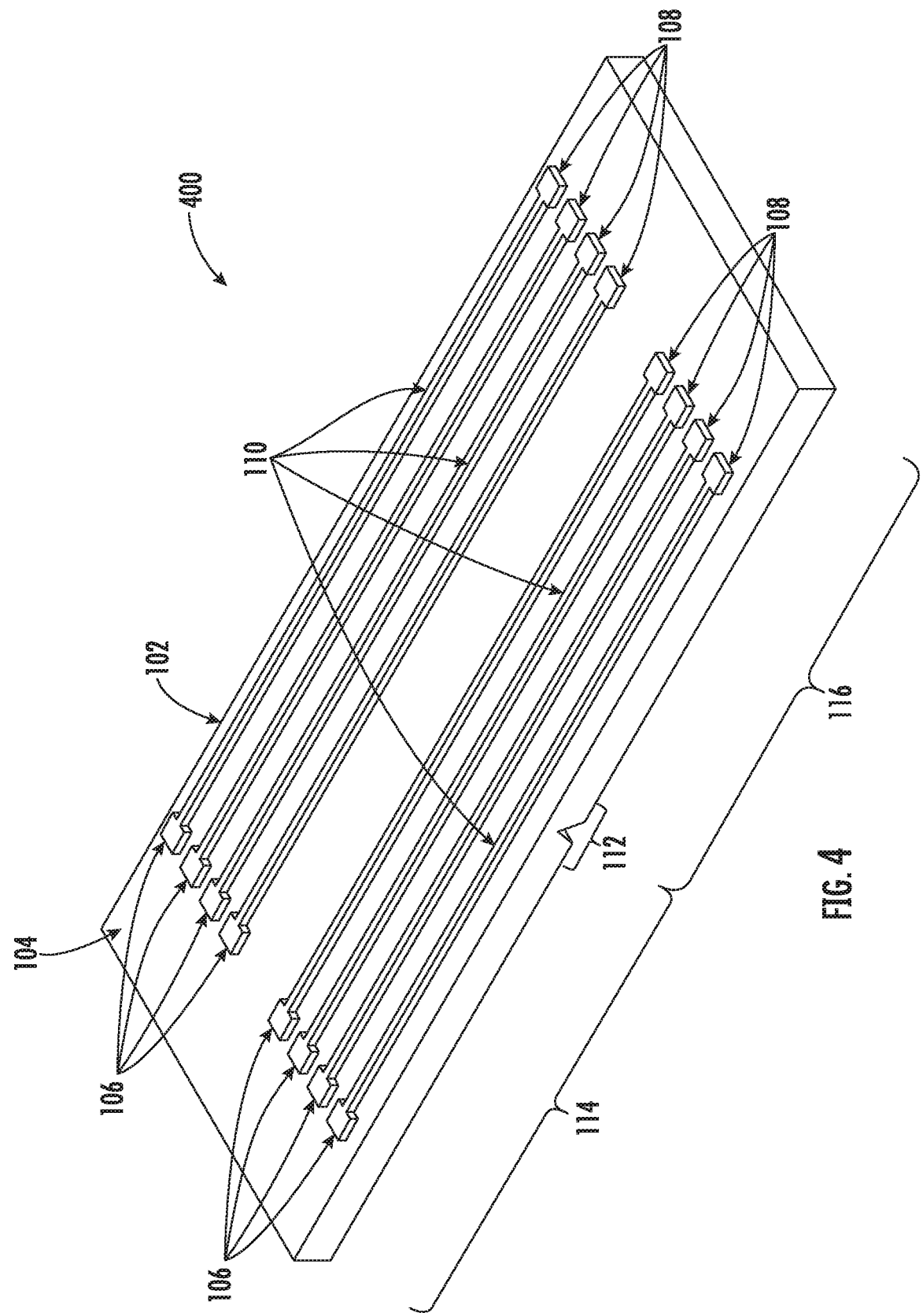
Figure 5:
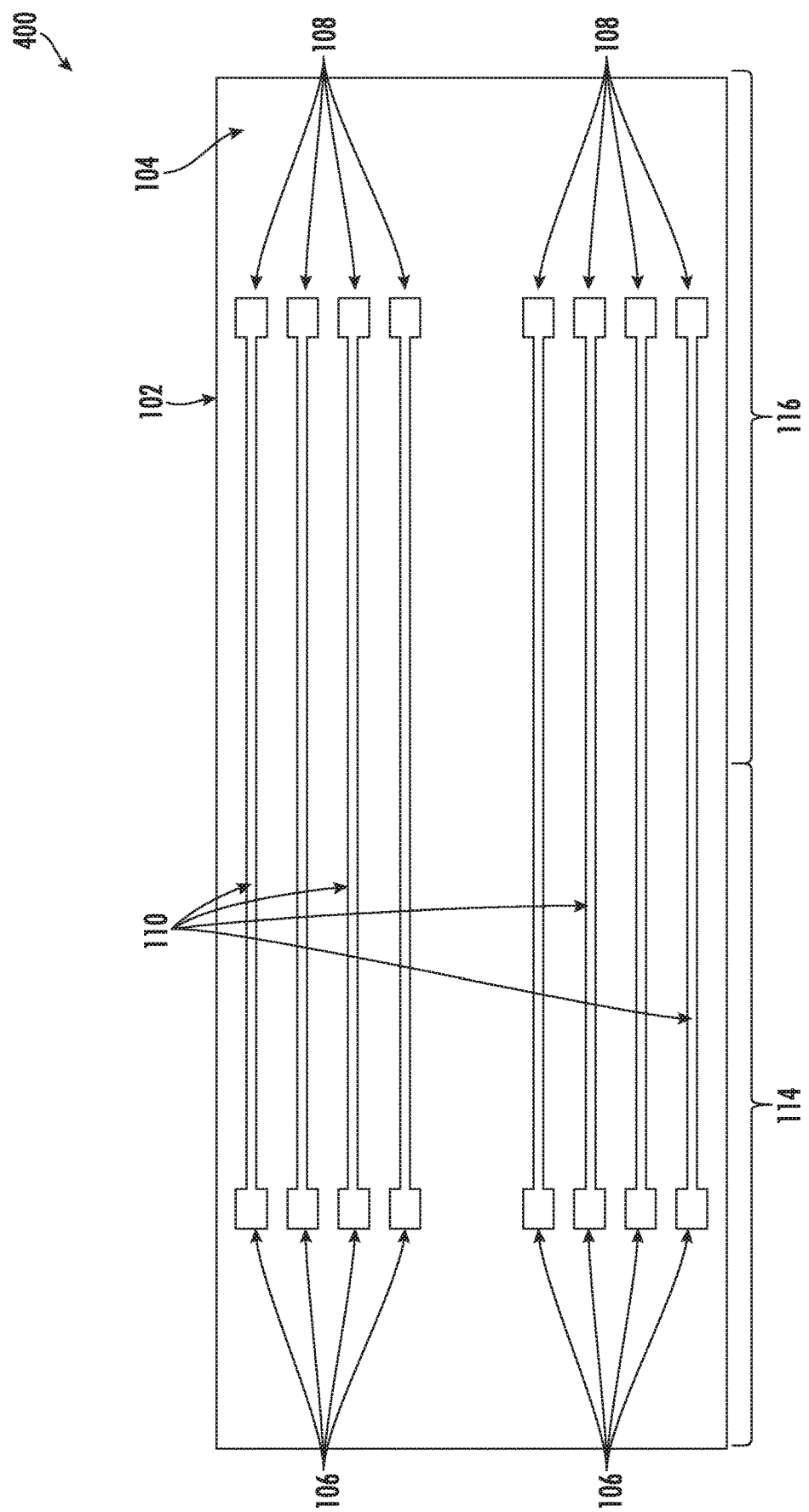
Figure 7:
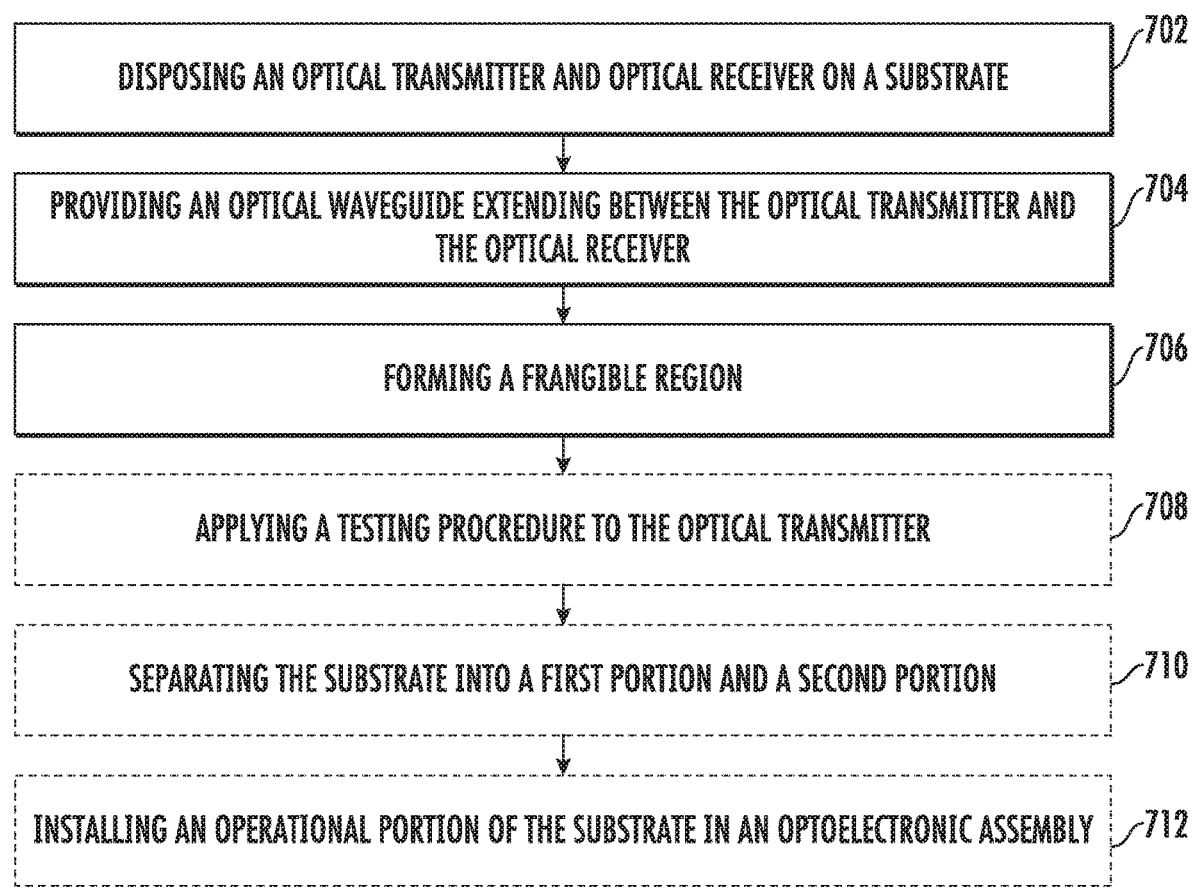
Figure 8:
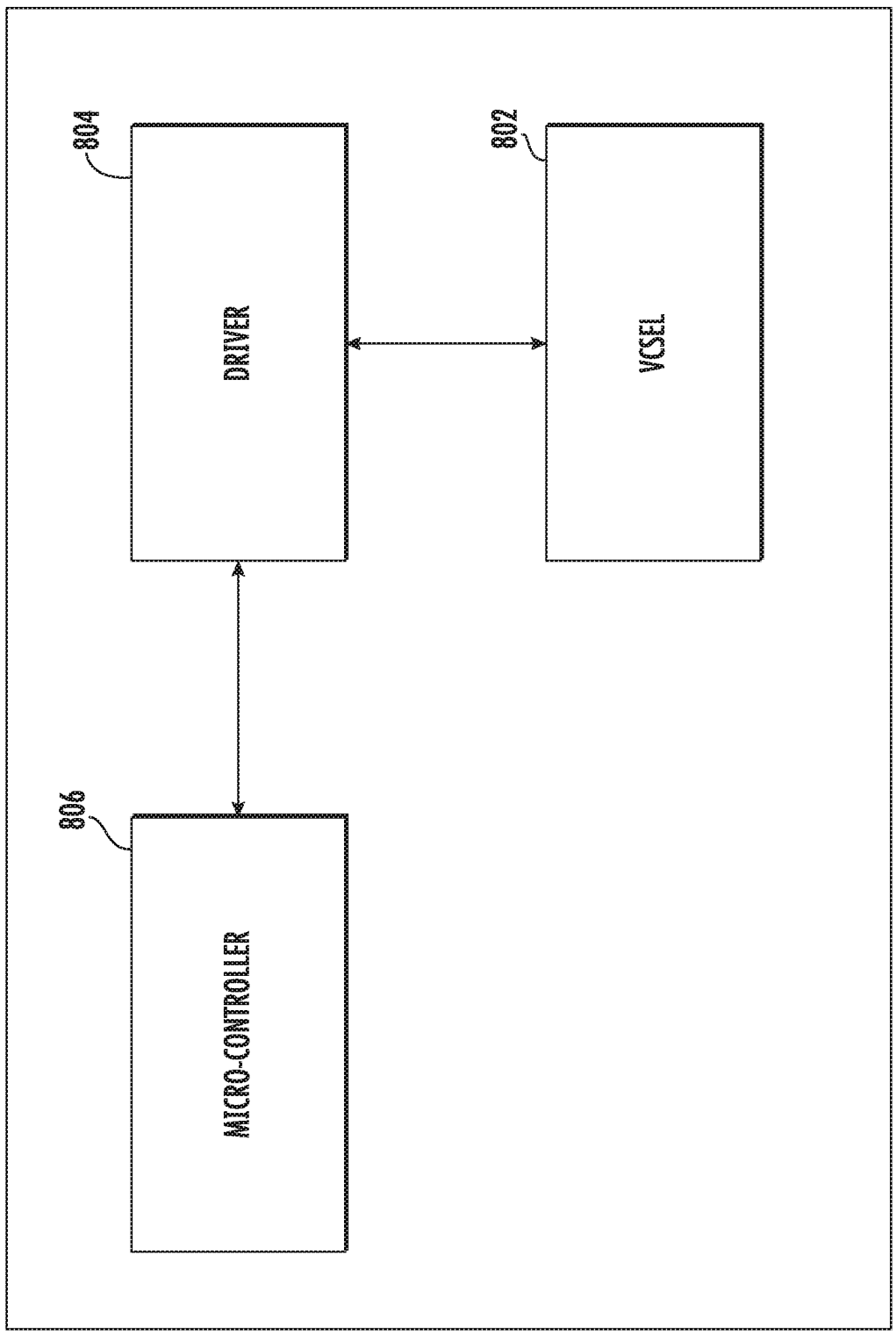

Having thus described the invention in general terms, reference will now be made to the accompanying drawings, which are not necessarily drawn to scale, and wherein:

FIG. 1 is a perspective view of an optical component assembly in a testing configuration according to an example embodiment;

FIG. 2 is a top view of the optical component assembly of FIG. 1 according to an example embodiment;

FIGS. 3A-3B are top views of an optical component assembly of FIG. 1 in an operational configuration according to an example embodiment;

FIG. 4 is a perspective view of an optical component assembly in a testing configuration according to another example embodiment;

FIG. 5 is a top view of the optical component assembly of FIG. 4 according to an example embodiment;

FIGS. 6A-6B are top views of an optical component assembly of FIG. 4 in an operational configuration according to an example embodiment;

FIG. 7 shows a flowchart depicting a method of manufacturing an optical component assembly and associated optical component testing procedures according to an example embodiment; and FIG. 8 shows a block diagram schematically illustrating an optical transmitter/transceiver system, in accordance with some embodiments discussed herein.

DETAILED DESCRIPTION

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. As used herein, the term "optical waveguide" may encompass any structure configured to allow light to propagate therethrough, notably containing regions made of materials having a relatively higher refractive index as compared to surrounding structure. As would be evident by one of ordinary skill in the art in light of the present disclosure, the term "substantially" indicates that the referenced element or associated description is approximately or others located within applicable engineering tolerances. As discussed herein, the example embodiment may be described with reference to a vertical-cavity surface-emitting laser (VCSEL) as an element of a transceiver system or optical transmitter. However, the present disclosure may be equally applicable for use with any transceiver system element, and/or light source (e.g., laser). As used herein, the disclosure may refer to an optical transmitter as an optical component which transmits an optical signal and an optical receiver as an optical component which receives an optical signal. However, the present disclosure contemplates that in any of the embodiments described herein, the optical transmitter and/or the optical receiver may transmit optical signals, receive optical signals, and convert between optical signals and electrical signals.

Extensive growth in global internet traffic due to increasing demands for high-definition video and high-speed broadband penetration has required new hardware that allows for higher data transmission rates in data centers. This growth has resulted in the use of optical fibers offering enhanced capacity (e.g., greater bandwidth) over distance, increased bandwidth density, greater security and flexibility, and lower costs as compared to conventionally-used copper cables.

Accordingly, various different types of optical components and associated assemblies also exist for enabling transmission of signals (optical and/or electrical) between switch modules and other optoelectronic equipment in a data center. For example, Quad Small Form-factor Pluggable (QSFP) connectors and cables, as well as other forms of connectors such as Small Form Pluggable (SFP) and C-Form-factor Pluggable (CFP) connectors, have long been the industry standard for providing high-speed information operations interface interconnects. More recently, Octal Small Form-factor Pluggable (OSFP) transceivers have come about to provide increased bit rate capabilities of up to 400 Gbps. Optical transmitter/receiver systems and optical waveguide structures may be used to interface with a switch system board and convert between optical and electrical signals, regardless of the type of optoelectronic connector.

In many transmitter/receiver systems, transducers, such as VCSELs, are used to generate optical signals for transmission over optical fibers and/or optical waveguides. VCSELs in particular are favored for their high bandwidth and efficiency. In some implementations, an array of such VCSELs is used to drive a corresponding array of optical fibers or waveguides, which are joined together in a ribbon configuration. Similarly, photodiodes may be used to receive optical signals transmitted over optical waveguides and to convert the optical signals to electrical signals for downstream processing. Optical waveguides may be connected to both VCSELs and photodiodes such that one or more photodiodes may receive the light from the VCSELs at a receiving end of the optical waveguides and convert the incident light into electrical signals.

In manufacturing these optical components, specifically VCSELs and photodiodes, traditional methods for ensuring the integrity of the optical components (e.g., signal integrity, appropriate link budget, or other operational parameters) prior to commercial use, such as in a high bandwidth environment, have proven inefficient and expensive. Accordingly, embodiments of the present invention that are described hereinbelow provide an optical component assembly and associated method of manufacturing for determining or otherwise quantifying the likelihood of success of optical components prior to the installation of the optical components in a commercial environment.

Optical Component Assembly

With reference to FIGS. 1-2, a perspective view and a top view of an optical component assembly in a testing configuration 100 are illustrated. The optical component assembly 100 may include a substrate 102 configured to support one or more optical components (e.g., an optical transmitter 106 and/or an optical receiver 108). The substrate 102 may define a first surface 104, wherein the one or more optical components may be disposed on the first surface 104. The substrate 102 may be manufactured from any suitable optical substrate material (e.g., silicon, graphene, glass, plastic, silicon on insulator ("SOP") wafers, silicon nitride, or the like). Although described herein with reference to a substrate, the present disclosure contemplates that the one or more optical components may be disposed on any applicable supporting structure (e.g., base member, printed circuit board, or the like).

The optical component assembly 100 may further include an optical transmitter 106 (e.g., a VCSEL or other emitter) and an optical receiver 108 (e.g., a photodiode) disposed on the first surface 104 of the substrate 102. The optical transmitter 106 may be configured to receive an electrical signal (e.g., from an external source) and may be further configured to convert the electrical signal to an optical signal. Similarly, the optical receiver 108 may be configured to receive the optical signal and convert the optical signal to an electrical signal for transmission to an external device or component. The optical component assembly 100 may include an optical waveguide 110 extending between the optical transmitter 106 and the optical receiver 108, wherein the optical waveguide 110 is configured to direct the optical signal from the optical transmitter 106 to the optical receiver 108. By way of example, the optical transmitter 106 may receive an electrical signal from an external data center connector and may convert this electrical signal to a corresponding optical signal for transmission to the optical receiver 108 via the optical waveguide 110. Although described with reference to a single optical transmitter 106 and a single optical receiver 108, the present disclosure, as shown in FIGS. 1-3, contemplates any number of optical transmitters and corresponding optical receivers in optical communication via corresponding optical waveguides.

The optical component assembly 100 may further include a frangible region 112 defining a first portion 114 and a second portion 116 of the substrate 102. The frangible region 112 may be further configured to allow the first portion 114 to be separated from the second portion 116. The frangible region 112 may, in some embodiments, be defined by the substrate 102 to be substantially perpendicular to at least a portion of the optical waveguide 110 supported by the first portion 114 of the optical component assembly 100. Although depicted as a notch 118 defined by a surface opposite the first surface 104 in FIG. 1, the present disclosure contemplates that the frangible region 112 may be located at any position of the substrate 102 so long as the optical component assembly 100 may be separated into at least a first portion 114 and a second portion 116. By way of example, the present disclosure contemplates that the frangible region 112 may be disposed along any length, width, depth, or angle with regard to the substrate 102.

The frangible region 112 may, in some embodiments, be defined as a notch, line of weakness, or other stress concentration location such that the optical component assembly may be spilt, broken, cleaved, or otherwise divided in a controlled manner into the first portion 114 and the second portion 116. In some embodiments, the frangible region 112 may be defined as an internal stress concentration location by a cleaving process such that the frangible region 112 is not visible. A cleaving process is a controlled breaking process configured to result in a flat endface (e.g., an endface(s) 206 in FIG. 3) between at least two portions. By way of example, the frangible region 112 of the optical component assembly in a testing configuration 100 may be scribed, such that a notch, scribe, or other stress concentration location is formed in the substrate 102. This scribe may not be visible without the assistance of a microscope or other visual enhancement device. The optical component assembly 100 may then be subjected to a tensile force such that the first portion 114 is cleaved from the second portion 116 resulting in a substantially flat, perpendicular endface for each of the first portion 114 and the second portion 116 (e.g., the endfaces 206,602 in FIGS. 2 and 6, respectively).

Although described above in reference to a cleaving or scribe-and-break process, the present disclosure contemplates that any method for separating the optical component assembly 100 into at least two portions (e.g., laser cutting, machining, water-jet cutting, chemical etching, physical etching, dicing, or the like) may be used. Further, the present disclosure contemplates that the frangible region 112 may be formed during the manufacturing of the substrate. By way of example, a stress concentration location may be formed in a layering process for creating the substrate. In such a process, the parameters of the layering process (e.g., temperature layer, cooling rate, material choice, and the like) may be modified to create an internal frangible region.

As shown by the optical component assembly in a testing configuration 100 in FIGS. 1-2, the first portion 114 may be integrally connected to the second portion 116 via the frangible region 112 for communicating optical signals between the optical transmitter 106 and the optical receiver 108 via the optical waveguide 110. When the optical component assembly is in a testing configuration 100, optical communication between the optical transmitter 106 and the optical receiver 108 via the optical waveguide 110 is possible such that a testing procedure may be administered to the optical component assembly 100. As discussed further with reference to FIG. 7 below, a defined input (e.g., current or voltage) may be inputted to the optical transmitter 106 from an optoelectronic testing element (e.g., a driver 804 and/or microcontroller 806 in FIG. 8). The optical transmitter 106 may convert the input from an electrical signal to an optical signal and transmit the optical signal to the optical receiver 108 via the optical waveguide 110. The optical receiver 108 may be configured to convert the optical signal to an electrical signal for transmission to the optoelectronic testing element. The optoelectronic testing element may be configured to analyze the electrical signal output from the optical receiver 108 to determine various operating parameters of one or more of the optical transmitter 106 or optical receiver 108 based on a comparison of the output signal with the input signal. In some embodiments, as described below, the optical transmitter 106 or the optical receiver 108 may comprise the optoelectronic testing elements (e.g., the driver 804 and/or microcontroller 806 in FIG. 8) and either of the optical transmitter 106 or the optical receiver 108 may determine and analyze various operational parameters of any of the optical components discussed herein.

With reference to FIGS. 3A-3B, an optical component assembly in an operational configuration 200 is shown. In an operation configuration, the optical component assembly 200 is separated into the first portion 114 and the second portion 116. The optical component assembly may be modified from a testing configuration 100, as shown in FIGS. 1-2, to an operational configuration 200 by separation of the first portion 114 from the second portion 116 via the frangible region 112. In an operational configuration 200, the first portion 114 may be separated from the second portion 116 such that communication of optical signals between the optical transmitter 106 and the optical receiver 108 is precluded. By way of example, when the optical component assembly 200 is separated into two portions, a portion of the optical waveguide (e.g., optical waveguide 110 in FIGS. 1-2) may be configured to be operational when merged with or otherwise connected to an optical fiber. Each of the operational optical waveguides 204, as seen in FIG. 3A, may continue to be in optical communication with at least one of the optical transmitter 106 or the optical receiver 108.

In some embodiments, as shown in FIG. 3A, the optical transmitter 106 and the optical receiver 108 may be disposed on the first portion 114 in communication with a corresponding operational optical waveguide 204, while a second portion of the optical waveguide is disposed on the second portion 116. As shown in FIG. 3B, this loopback optical waveguide 202 located on the second portion 116 may not be in optical communication with an optical component (e.g., an optical transmitter 106 or an optical receiver 108) following separation of the two portions 114, 116. Further, in some embodiments, the loopback optical waveguide 202 may be disposed in a semi-circular orientation such that the optical transmitters and optical receiver may be located on the first portion 114. After modification from a testing configuration to an operational configuration, the first portion 114 may be configured to be installed in an optoelectronic component for operational use. Conversely, the loopback optical waveguide 202 disposed on the second portion 116 may be disposed.

As shown in FIGS. 3A-3B, the present disclosure contemplates that when the optical component assembly comprises a plurality of optical transmitters and optical receivers, the frangible region 112 may be configured to allow separation of the optical component assembly (e.g., when modified from a testing configuration 100 to an operational configuration 200) into the first portion 114 and the second portion 116, such that the transmission of optical signals between each optical transmitter and each corresponding optical receiver via only the optical waveguides 204 of the substrate 102 is precluded.

In some embodiments, with reference to FIGS. 4-5, an optical component assembly in a testing configuration 400 may be configured such that a plurality of optical transmitters 106 are disposed on the first portion 114 of the substrate 102 and a plurality of optical receivers 108 are disposed the second portion 116 of the substrate 102. In such an embodiment, with reference to FIGS. 6A-6B, when the optical component assembly is in an operational configuration 600, the plurality of optical transmitters 106 and the plurality of optical receivers 108 may be disposed on separate portions. In an operational configuration 600 as shown in FIGS. 6A-6B, portions of the optical waveguides (e.g., optical waveguide 110 in FIGS. 4-5) may be disposed on each of the first portion 114 and the second portion 116. These operational optical waveguides 204 may, as above, be in optical communication with at least one of an optical transmitter 106 or an optical receiver 108. Further, these operational optical waveguides 204 may be configured to be operational when connected with or otherwise merged with an optical fiber or an optoelectronic connector. After modification from a testing configuration to an operational configuration, the first portion 114 and/or the second portion 116 may be configured to be installed in an optoelectronic component for operational use.

Although illustrated in FIGS. 4-6B with optical transmitters 106 disposed on the first portion 114 and optical receivers 108 disposed on the second portion 116, the present disclosure contemplates that any set of the optical transmitters 106 or optical receivers 108 may be disposed on either the first portion 114 and/or the second portion 116. By way of example, the first portion 114 may comprise both optical transmitters 106 and optical receivers 108 in communication with a corresponding operational optical waveguides 204, and the second portion 116 may also comprise both optical transmitters 106 and optical receivers 108 in communication with corresponding operational optical waveguides 204.

Example Method of Manufacture

With reference to FIG. 7, a method of manufacturing an optical component assembly and associated testing procedure is illustrated. The method of manufacture (e.g., method 700) may include the steps of disposing an optical transmitter and an optical receiver on a substrate at Block 702. The method 700 contemplates that any means for disposing the optical transmitter and optical receiver on the substrate (e.g., a soldering process, applying adhesive, mechanical fastening, or the like) may be utilized. In some embodiments, the formation of a substrate may include forming optical transmitters and/or optical receivers which are integral to the substrate. By way of example, an additive manufacturing process (e.g., layering, 3-D printing, or the like) may be utilized to create the substrate such that the optical transmitters and optical receivers are formed integrally with the substrate. Further, the method 700 contemplates that the substrate may comprise any material suitable for use with optical components. The method 700 may further include providing an optical waveguide extending between the optical transmitter and the optical receiver at Block 704. This optical waveguide may be a glass optical fiber, plastic optical fiber, or the like, so long as optical signals may be transmitted therethrough. Similar to the formation of the optical transmitter and receiver described above, the present disclosure contemplates that the optical waveguides may also be formed integrally with the substrate.

The method 700 may including forming a frangible region at Block 706. As discussed above, in some embodiments, a cleaving process may be used to create precisely broken optical waveguides for use in splicing or otherwise connecting to other optoelectronic components. A cleaving process may scribe (e.g., score, scratch, notch, or the like) the substrate. The substrate may then be subjected to a tensile force substantially perpendicular to the scribe or line of weakness such that the substrate cleanly breaks into two portions. Although described in reference to a cleaving or scribe-and-break process, the present disclosure contemplates that any method for separating the optical substrate into two portions (e.g., laser cutting, machining, water-jet cutting, or the like) may be used.

The method 700 may include applying a testing procedure to the optical transmitter at Block 708. By way of example, the testing procedure may include applying a high bandwidth constant value input (e.g., a constant current or constant voltage) to the optical transmitter. The testing procedure (which may be implemented via a driver and/or a microcontroller) may monitor an output of the optical transmitter, calculate a link budget value, compare the link budget value to a baseline link budget value, and/or determine if the link budget values are substantially equivalent. The referenced baseline link budget value may be an operational parameter which equates to an acceptable quality or integrity state of the optical transmitter (e.g., indicative of its suitability for use in a high bandwidth environment). Based upon the results of the comparison, the testing procedure may determine a fail state of the optical transmitter or a pass state of the optical transmitter. If the procedure determines a fail state, the procedure may apply a modified input value and may repeat the procedure using iteratively modified input values until a pass state of the optical transmitter is achieved.

In some embodiments, the testing procedure may determine the modified input value through the use of a pseudorandom binary sequence (PRBS) algorithm. Specifically, the procedure may employ a PRBS-7 algorithm, as would be understood of one of ordinary skill in the art in light of the present disclosure, for calculating the appropriate modified input value such that the optical transmitter will operate in an acceptable manner when subjected to a high bandwidth. Although described in reference to applying the testing procedure to the optical transmitter, the present disclosure contemplates that the testing procedure may be equally applied to the optical receiver (such as in the case when the optical receiver is a photodiode).

The present disclosure contemplates that applying the testing procedure to the optical transmitter at Block 708 may be implemented in an optical transceiver system (e.g., the optical transmitter 106 in FIG. 1) via a driver and/or micro-controller (e.g., the driver 804 and the microcontroller 806 in FIG. 8) when the optical component assembly is in a testing configuration (e.g., as shown by optical component assemblies 100, 400 in FIGS. 1 and 4). In such an embodiment, the driver and/or micro-controller may continuously or continually monitor the output of the optical transmitter during testing and may continuously/continually compare a calculated a link budget value with a baseline link budget value, according to embodiments of the step described above at Block 708. In some embodiments, the procedure may determine a modified input value through defined relationships such as input impedance, the relationship V=IZ, where V is voltage, I is current, and Z is impedance, at high bandwidth. These characteristic are defined with respect to the optical transmitter and may be adjusted accordingly (such as by a driver or microcontroller) to achieve an optimal link budget value. Although described in reference to monitoring a link budget value, the present disclosure contemplates that any operational testing procedure may be applied to any optical component described herein.

Once a testing procedure has been applied to the optical transmitter at Block 708 and the component is suitable for operation, the method 700 may include separating the substrate into a first portion and a second portion at Block 710. As described above, the separation may occur through any technique suitable for optical components (e.g., does not negatively impact subsequent operability of the optical components). Similarly, although described herein as separation of the substrate into two portions, the present disclosure contemplates that any number of portions may be created. The separation of the substrate into a first portion and a second portion may preclude transmission of optical signals from the optical transmitter and the optical receiver of the substrate. Rather, this separation may result in an operational portion configured to be installed in an optoelectronic assembly at Block 712. By way of example, the operational portion may be a first portion of the substrate that includes an optical transmitter in optical communication with an optical waveguide. The operational portion may then be spliced or otherwise merged with an optoelectronic connector for use in a data center switch connection.

In some embodiments, the substrate may be installed in an optoelectronic assembly (e.g., at Block 712) prior to separation of the substrate into a first portion and a second portion (e.g., at Block 710). By way of example, in some embodiments, applying a testing procedure to the optical transmitter at Block 708 may occur in parallel to installing the substrate in an optoelectronic assembly at Block 712. In such an embodiment, the substrate may be separated into a first portion and a second portion while installed in an optoelectronic assembly such that the operational portion remains installed in the optoelectronic assembly and the other portion is removed from the optoelectronic assembly.

With reference to FIG. 8, for example, a block diagram is provided that shows schematically an optical transmitter system 800 capable of employing embodiments of the optical component testing procedure shown in FIG. 7. The optical transmitter system 800 may include a driver 804, a VCSEL 802, and/or a micro-controller 806. In some cases, the procedure may be implemented via firmware installed in the driver 804 and/or the micro-controller 806. For example, the driver 804 and/or the micro-controller 806 may include non-transitory computer-readable medium having computer instructions stored thereon. The driver 804 may be configured to provide an electrical input (e.g., a current) to the VCSEL 802 to produce an optical signal output from the VCSEL at a desired wavelength. The driver 804 may be embodied as hardware, software, and/or firmware, which may, in some cases, include the functionality of the micro-controller 806. In other cases, however, a separate micro-controller 806 may be provided that is in communication with the driver 804 and directs the operation of the driver, as shown in FIG. 8. Although described in reference to an optical transmitter and/or optical transceiver system, the present disclosure contemplates that the micro-controller 806, the driver 804, and any required circuitry may be located separately from the VCSEL 802 (e.g., separately from the optical transmitter 106 in FIG. 1) such that an external electrical signal is provided to the optical transmitter for conversion to an optical signal.

In some cases, the micro-controller 806 may be configured to direct the driver 804 to apply an input to the VCSEL 802, such that the output of the VCSEL 802 may be measured at the driver 804 by the micro-controller 806. The micro-controller 806 may be configured to ensure that the input values (e.g., the constant current or voltage values) remain constant for the duration of the applicable steps of the testing procedure.

Accordingly, as described above, FIG. 7 illustrates flowcharts of a method according to example embodiments of the invention. It will be understood that each block of the flowcharts, and combinations of blocks in the flowcharts, may be implemented by various means, such as hardware, firmware, processor, circuitry, and/or other devices associated with execution of software including one or more computer program instructions, as described above. For example, one or more of the testing procedures described above at Block 708 may be embodied by computer program instructions. In this regard, the computer program instructions which embody the procedures described above may be stored by a memory employing an example embodiment of the present invention and executed by a processor (e.g., the micro-controller or driver with controller circuitry, or a computer implementing a testing procedure while the optical component assembly is in a testing configuration). As will be appreciated, any such computer program instructions may be loaded onto a computer or other programmable apparatus (e.g., hardware) to produce a machine, such that the resulting computer or other programmable apparatus implements the functions specified in the flowchart block(s). These computer program instructions may also be stored in a computer-readable memory that may direct a computer or other programmable apparatus to function in a particular manner, such that the instructions which execute on the computer or other programmable apparatus provide operations for implementing the functions specified in the flowchart block(s).

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of any optical component or optoelectronic element. In addition, the method described above may include fewer steps in some cases, while in other cases may include additional steps. Modifications to the steps of the method described above, in some cases, may be performed in any order and in any combination.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An optical component assembly comprising:
   a substrate;
   an optical transmitter configured to generate an optical signal, wherein the optical transmitter is disposed on a first surface of the substrate;
   an optical receiver configured to receive the optical signal, wherein the optical receiver is disposed on the first surface of the substrate;
   an optical waveguide extending between the optical transmitter and the optical receiver, wherein the optical waveguide is configured to direct the optical signal from the optical transmitter to the optical receiver; and
   a frangible region comprising a notch, wherein the frangible region defines a first portion of the substrate and a second portion of the substrate, wherein the frangible region is configured to allow the first portion to be separated from the second portion,
   wherein the optical component assembly is configured to be modified from a testing configuration, in which the first portion is integrally connected to the second portion via the frangible region for communicating optical signals between the optical transmitter and the optical receiver via the optical waveguide, to an operational configuration, in which the first portion is separated from the second portion such that communication of optical signals between the optical transmitter and the optical receiver is precluded,
   wherein in the operational configuration, at least one of the first portion or the second portion is configured to be operable in an optical assembly.

2. The assembly according to claim 1, further comprising a plurality of optical transmitters disposed on the first surface and a plurality of corresponding optical receivers disposed on the first surface, wherein each optical transmitter is connected to a corresponding optical receiver via an optical waveguide.

3. The assembly according to claim 2, wherein the frangible region is further configured to allow separation of the optical component assembly into the first portion and the second portion such that the transmission of optical signals between each optical transmitter and each corresponding optical receiver is precluded.

4. The assembly according to claim 1, wherein the optical transmitter and the optical receiver are disposed on the first portion of the substrate and a loopback waveguide portion is disposed on the second portion of the substrate.

5. The assembly according to claim 1, wherein the optical transmitter is disposed on the first portion of the substrate and the optical receiver is disposed on the second portion of the substrate.

6. The assembly according to claim 1, wherein the optical transmitter is a vertical-cavity surface-emitting laser and the optical receiver is a photodiode.

7. The assembly according to claim 1, wherein the frangible region is achieved via a cleaving process.

8. The assembly according to claim 1, wherein the frangible region comprises a scribe line, wherein separation of the assembly into at least two portions is achieved via a scribe and break process.

9. The assembly according to claim 1, wherein in a testing configuration, the assembly is further configured to connect with an optoelectronic testing element such that the optical transmitter is configured to receive electrical signals from the optoelectronic testing element.

10. A method of manufacturing an optical component assembly, the method comprising:
    providing a substrate;
    disposing an optical transmitter configured to generate an optical signal on a first surface of the substrate;
    disposing an optical receiver configured to receive the optical signal on the first surface of the substrate;
    providing an optical waveguide extending between the optical transmitter and the optical receiver, wherein the optical waveguide is configured to direct the optical signal from the optical transmitter to the optical receiver; and
    forming a frangible region comprising a notch, wherein the frangible region defines a first portion of the substrate and a second portion of the substrate, wherein the frangible region is configured to allow the first portion to be separated from the second portion, wherein the optical component assembly is configured to be modified from a testing configuration, in which the first portion is integrally connected to the second portion via the frangible region for communicating optical signals between the optical transmitter and the optical receiver via the optical waveguide, to an operational configuration, in which the first portion is separated from the second portion such that communication of optical signals between the optical transmitter and the optical receiver is precluded, wherein in the operational configuration, at least one of the first portion or the second portion is configured to be operable in an optical assembly.

11. The method according to claim 10, further comprising disposing a plurality of optical transmitters and a plurality of corresponding optical receivers on the first surface, wherein each optical transmitter is connected to a corresponding optical receiver via an optical waveguide.

12. The method according to claim 11, wherein the frangible region is further configured to allow separation of the optical component assembly into the first portion and the second portion such that the transmission of optical signals between each optical transmitter and each corresponding optical receiver is precluded.

13. The method according to claim 10, wherein the optical transmitter and the optical receiver are disposed on the first portion of the substrate and a loopback waveguide portion is disposed on the second portion of the substrate.

14. The method according to claim 10, wherein the optical transmitter is disposed on the first portion of the substrate and the optical receiver is disposed on the second portion of the substrate.

15. The method according to claim 10, wherein the optical transmitter is a vertical-cavity surface-emitting laser and the optical receiver is a photodiode.

16. The method according to claim 10, wherein forming the frangible region is achieved via a cleaving process.

17. The method according to claim 10, wherein forming the frangible region comprises scribing the substrate and separating of the assembly into at least two portions is achieved via a scribe-and-break process.

18. The method according to claim 10, wherein in a testing configuration, the assembly is further configured to connect with an optoelectronic testing element such that the optical transmitter is configured to receive electrical signals from the optoelectronic testing element.

* * * * *